(12) United States Patent
Kim

(10) Patent No.: US 7,651,270 B2
(45) Date of Patent: Jan. 26, 2010

(54) AUTOMATED X-RAY OPTIC ALIGNMENT WITH FOUR-SECTOR SENSOR

(75) Inventor: Bonglea Kim, Troy, MI (US)

(73) Assignee: Rigaku Innovative Technologies, Inc., Auburn Hills, MI (US)

(*) Notice: Subject to any disclaimer, the term of this patent is extended or adjusted under 35 U.S.C. 154(b) by 45 days.

(21) Appl. No.: 11/848,700

(22) Filed: Aug. 31, 2007

(65) Prior Publication Data

US 2009/0060144 A1 Mar. 5, 2009

(51) Int. Cl.
*A61B 6/08* (2006.01)
(52) U.S. Cl. ....................... 378/205; 378/162
(58) Field of Classification Search ............ 378/70–90, 378/162, 163, 204–207
See application file for complete search history.

(56) References Cited

U.S. PATENT DOCUMENTS

| | | | |
|---|---|---|---|
| 5,285,488 | A | 2/1994 | Watanabe et al. |
| 5,757,882 | A | 5/1998 | Gutman |
| 6,389,100 | B1 | 5/2002 | Verman et al. |
| 6,778,636 | B1 | 8/2004 | Andrews |
| 6,898,270 | B2 | 5/2005 | Lange et al. |
| 7,023,962 | B2 | 4/2006 | Xu et al. |

FOREIGN PATENT DOCUMENTS

GB 2 359 718 A 8/2001

OTHER PUBLICATIONS

Jeong Seongtae, et al, 'At-wavelength detection of extreme ultraviolet lithography mask blank defects JOURNAL OF VACUUM SCIENCE AND TECHNOLOGY B: MICROELECTRONICSPROCESSING AND PHENOMENA, AMERICAN VACUUM SOCIETY, New York, NY, US, vol. 16, No. 6 Nov./Dec. 1998, pp. 3430-3434.

Giampiero Naletto, et al., "Performance of a thinned back-illuminated ion-implanted CCD as detector for a normal incidence EUV spectrograph", MEASUREMENT SCIENCE AND TECHNOLOGY, IOP, Bristol, GB, vol. 5, No. 12, Dec. 1, 1994, pp. 1491-1500.

J.H. Underwood, et al., "Calibration and standards beamline 6.3.2 at the Advanced Light Source", REVIEW OF SCIENTIFIC INSTRUMENTS AIP—9th INSTRUMENTATION, vol. 67, No. 9, Sep. 1996, pp. 1-5.

*Primary Examiner*—Jurie Yun
(74) *Attorney, Agent, or Firm*—Brinks Hofer Gilson & Lione

(57) ABSTRACT

A system for x-ray optical alignment. The system includes an x-ray source, an optic, a collimation element, and alignment sensors. The x-ray source generates an x-ray beam that is directed by the optic at a sample. The collimation element is located between the optic and the sample to define the profile of the x-ray beam. The sensors receive the x-ray beam from the optic and generated signal indicative of the system alignment. The sensors may be located on a surface of the collimation element facing the optic. The inner edge of the sensors may be located at equal intervals radially about the collimation element and may form an aperture having a symmetric shape.

24 Claims, 2 Drawing Sheets

AUTOMATED X-RAY OPTIC ALIGNMENT WITH FOUR-SECTOR SENSOR

BACKGROUND OF THE INVENTION

1. Field of the Invention

The present invention relates to an automated alignment device for x-ray optical systems.

2. Description of Related Art

X-ray optical systems are extremely valuable tools that are employed in a wide variety of applications. For example, systems are commonly employed in areas such as semiconductor manufacture and fabrication, medical research and materials analysis.

Generally, in these systems, a source provides an x-ray beam, and in many applications, there is often a need to control the size and dimension of the pattern of the x-ray beam that is emitted from the source. In some applications, conditioning of the x-ray beam is accomplished using real or synthetic crystals, apertures, and other elements. The desired condition of an x-ray source is dependent on the particular application involved.

In many x-ray optical systems, a collimator in the form of an aperture or slit is employed to define an appropriate x-ray irradiation shape. The aperture has an opening which permits the passage of an x-ray beam with a certain energy. A portion of the collimator around the opening blocks undesirable x-rays. The position of the aperture is typically changeable to adjust the range of x-ray transmitted, for example, to a sample that is to be characterized.

In certain x-ray optical systems, an optic, such as a multilayer optic, is periodically examined and aligned if necessary relative to the x-ray source, or x-ray source relative to optic. Typically, the alignment process of the optic is performed when the system is not in operation. This requires a periodic alignment process to be carried out, requiring specialized procedures and taking the equipment off-line. Accordingly, it is desirable to combine the collimation of the x-ray beam and monitoring the optical alignment to provide automated optic alignment.

SUMMARY OF THE INVENTION

In satisfying the above need, as well as overcoming the enumerated drawbacks and other limitations of the related art, the present invention provides a system for x-ray optical alignment. The system includes an x-ray source, an optic, a collimation element, and alignment sensors. The x-ray source generates an x-ray beam that is directed by the optic at a sample. The collimation element is located between the optic and the sample to collimate the x-ray beam. The sensors receive the x-ray beam from the optic and generate a signal indicative of the system alignment. The sensors may be located on a surface of the collimation element facing the optic. The inner edge of the sensors may be located at equal intervals radially about the collimation element and may form an aperture having a symmetric shape.

The sensors may be formed from scintillation material coupled to a photo multiplier tube or, alternatively, a photoelectric sensor such as a photodiode. Signals from the sensors may be received by a controller that compares the signal between each sensor or, alternatively, between subsequent signals from the same sensor to determine if the system is aligned.

In addition, the system may include a beam stopper located between the sample position and a detector. The beam stopper may include a sensor facing the optic and configured to measure the intensity of the x-ray beam.

Further features and advantages will be apparent from the following description, and from the claims.

DETAILED DESCRIPTION OF THE INVENTION

Figure 1:
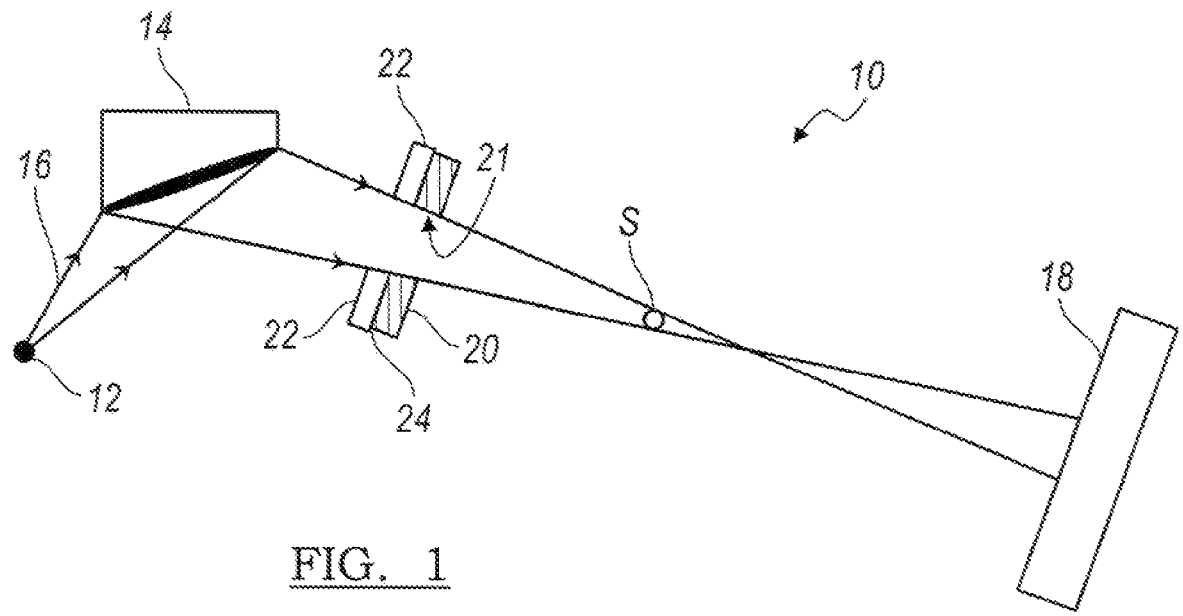
FIG. 1 is a schematic drawing of an x-ray optical system in accordance with the present invention.

In accordance with one embodiment of the invention, FIG. 1 illustrates an x-ray optical system 10 including an x-ray source 12 and an x-ray optic 14. The x-ray source 12 can be a laboratory source, such as a high brilliance rotating anode, a sealed tube x-ray generator, or a microfocusing source, and the optic 14 can be a reflector such as a Bragg diffraction element, such as a multilayer optic with one or two reflective planes, a total reflection optic, or an x-ray reflective crystal.

In operation, the source 12 emits an x-ray beam 16 toward the optic 14, which in turn directs the x-ray beam 16 toward a sample S. The x-rays from the sample S are then captured by a detector 18. In certain implementations, such as systems that employ laterally graded multilayer optics in a side by side arrangement (i.e., Confocal Max-Flux® (CMF) optics), beam collimators in the form of a slit or aperture are often used to shape the x-ray beam 16 coming from the optic 14. Accordingly, a collimator 20 is positioned between the optic 14 and the sample S to shape the x-ray beam 16 reflected from the optic 14, allowing a beam with a desired energy through an aperture 21.

In accordance with one embodiment, the collimator 20 includes x-ray sensors that monitor alignment changes of the optic 14 to provide information for automated optic or source alignment. The sensors 22 detect the edge profile of the reflected beam from the optic 14 and do not interfere with x-rays that pass through the collimator 20. As such, the alignment procedure can be carried out during regular data collection. Further, the directional information provided by the sensors 22 can be employed to determine the axis and direction for the alignment process to make the process faster.

Figure 2:
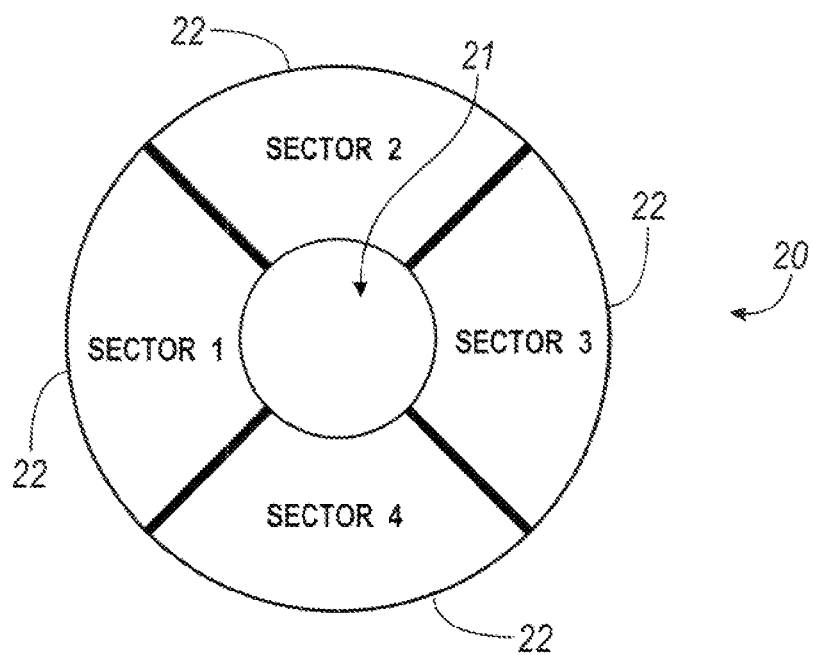
FIG. 2 is an end view of a collimator for the system of FIG. 1 with a set of alignment sensors.

In the system 10, the dimension of the reflected beam from the optic 14 is typically larger than the cross section of the aperture 21 of the collimator 20. As shown in FIG. 2, a set of four sensors 22 are located on a surface 24 of the collimator 20 facing the optic 14 about the aperture 21. The sensors 22 may be radially spaced at equal intervals, for example every 90 degrees, about the aperture 21. Although, a different number of detectors or spacing may be readily used. Typically an optic with one reflecting surface requires one dimensional alignment with one pair of sensors. A CMF optic has two perpendicular reflecting surfaces and, therefore, four sensors are needed to align the optics in two dimensions. In operation, the sensors 22 measure the edge intensities of the beam profile that are projected onto the sensors 22. Accordingly, the portion of the x-ray that is received by the sensors 22 does not pass through the collimator 20. After an initial alignment of the optic 14, a set of reference readings are obtained from the sensors 22. Later, readings from the sensors 12 may be compared to the reference readings by a controller. Deviations from the recorded reference suggests performing a new optic alignment. Further comparing sensors on opposite sides of the aperture 21 may provide an indication that the beam is pointed to one side or the other of the collimator 20. For example, an increased signal from sector 3 (and, hence, a decreased signal from sector 1) indicates that the beam is aiming toward the sector 3 side of the sensors 22 (i.e., the right side as shown in FIG. 1). Depending on the hardware configuration, a suitable action can be taken to correct the symptom. For example, the optic or source may be moved automatically by a motion device such as one or more motorized linear or rotary stages. Alternatively, the position of the optic or source may be adjusted manually using a linear or rotary stage with an adjustable screw. The controller may provide a graphical display illustrating the direction to move the optic or source. Similarly, an audible signal may be provided to guide the movement of the optic or source. In one example, the frequency or tone of the sound may correspond to the alignment of the beam. (i.e. quicker beeps may equate to better alignment)

The sensors 22 may be fan shaped, as shown in FIG. 2, or they may have different shapes depending on the inner profile of the aperture and the available space for the sensors 22. The aperture 21 formed by the inner edge of the sensors 22 is symmetric such that an equal displacement toward each sensor generally corresponds to an equal change in x-ray flux received by the sensor. Accordingly, the aperture 21 may have a circular or square shape. Each sensor may be formed from scintillation material coupled with one end of a respective optical fiber. The other end of the fiber may be coupled to a readout device such as a photo multiplier tube. Alternatively, solid state photo-electric sensors such as photodiodes may be used.

Figure 3:
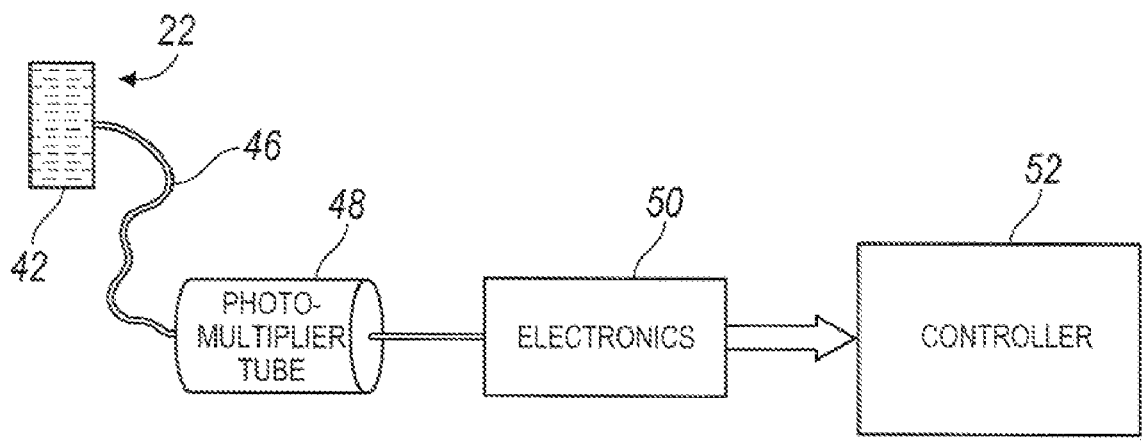
FIG. 3 is a schematic diagram of a system including sensors formed from scintillation material.

As shown in FIG. 3, the sensors 22 may be formed from scintillation material 42 configured to collect the x-rays from the collimator 20. The scintillation material 42 is in communication with a photo multiplier tube 48 through an optical fiber 46. The photo multiplier tube 48 produces a pulsed signal where each pulse corresponds to a photon received by the sensor 22. The electronics 50 receives the pulsed signal and counts the number of photons received corresponding to the portion and intensity of the x-ray beam that is projected onto the scintillation material 42. The electronics 50 provides a signal to the controller 52, such as a computer or microprocessor, to further automate or aid in the alignment of the system.

Figure 4:
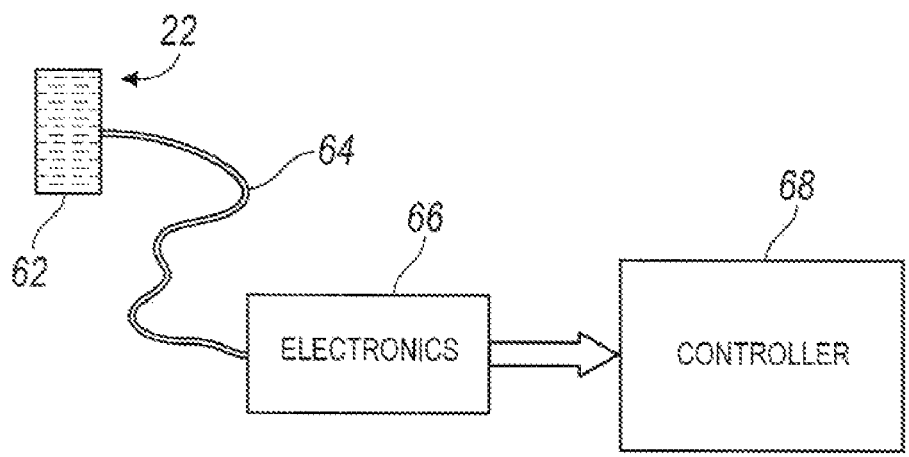
FIG. 4 is a schematic diagram of a system using sensors formed from photodiodes.

As shown in FIG. 4, the sensors 22 may be formed from a photodiode 62 that receives the x-ray beam and generates an analog electrical signal corresponding to the flux of the x-ray beam received by the photodiode 62. The analog electrical signal may be provided via leads 64, such as electrical wires or traces, to amplifying electronics 66. Alternatively, the electronics 66 may provide a representation of the comparative flux received between two opposite sensors (i.e., sector 1 and sector 3). As such, the comparative value may provide an indication as to the alignment or misalignment of the optic or source. Signals from the electronics 66 are provided to the controller 68. Controller 68 may utilize the signals from electronics 66 to further automate or aid the optical system as described above.

Figure 5:
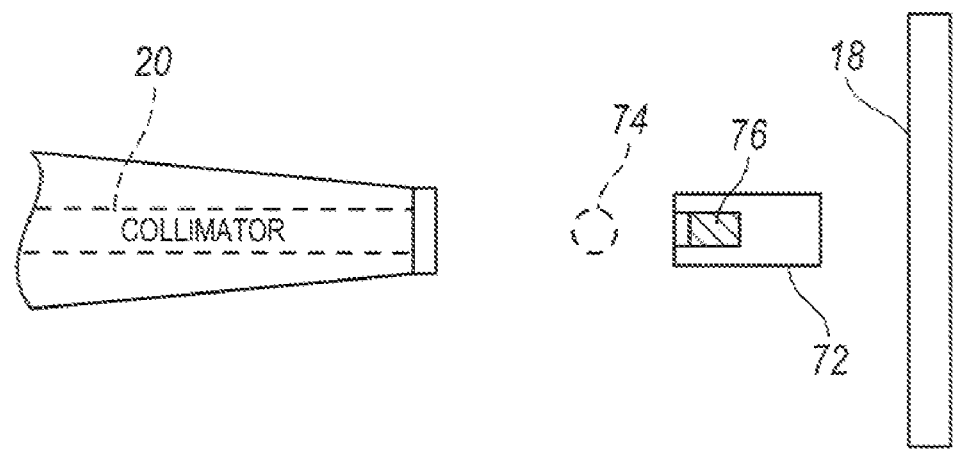
FIG. 5 is a top view of the portion of an optical system including a beam stopper.

As shown in FIG. 5, a portion of the optical system illustrated in FIG. 1 is provided including a beam stopper 72. The beam stopper 72 includes a sensor 76 facing the optic and configured to receive the x-ray beam that passes through the collimator 20. In addition, the beam stopper 72 and the sensor 76 are located between the collimator 20 and the detector 18, more specifically the beam stopper 72 and the sensor 76 may be located between the sample position 74 and the detector 18 although the sample will generally be removed while the sensor 76 measures the intensity of the x-ray beam. While the sensors 22 (from FIGS. 1 and 2) utilize multiple elements located on opposite sides of the collimator, the sensor 76 may be a single element used to determine the intensity of the x-ray beam thereby providing an indication of the efficiency of the optical alignment between the x-ray source, the optic, and the collimator. As such, the controller may receive a signal from the sensor 76 indicative of the x-ray beam intensity and automatically adjust the alignment or provide an adjustment aid as described above.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

What is claimed is:

1. A system for x-ray optic alignment, the system comprising:
    an x-ray source for generating an x-ray beam;
    an optic configured to direct the x-ray beam at a sample;
    a collimation element located between the optic and the sample, the collimation element having at least one sensor configured to receive the x-ray beam from the optic wherein the signal from the sensor is indicative of system alignment.

2. The system according to claim 1, wherein the collimation element includes an aperture.

3. The system according to claim 2, wherein the aperture allows the x-ray beam to pass therethrough, and the at least one sensor being fixed to a surface of the collimation element facing the optic.

4. The system according to claim 1, wherein the at least one sensor is a plurality of sensors located at equal intervals radially about the collimation element.

5. The system according to claim 4, wherein each sensor of the at least one sensor forms an aperture having a symmetric shape.

6. The system according to claim 1, wherein the at least one sensor is at least four sensors located at approximately 90 degree intervals about the collimation element.

7. The system according to claim 1, further comprising a controller configured to capture the signal from the at least one sensor.

8. The system according to claim 7, wherein the controller is configured to compare the signal to a subsequent signal generated by the at least one sensor to determine if the system is aligned.

9. The system according to claim 1, wherein the at least one sensor includes scintillation material coupled with an optical fiber.

10. The system according to claim 9, wherein the optical fiber is connected to a photo-multiplier tube.

11. The system according to claim 1, wherein the at least one sensor includes a photoelectric sensor.

12. The system according to claim 1, further comprising a beam stopper and a detector, the detector being configured to receive x-rays from the sample, the beam stopper being located between the sample and the detector, wherein a surface of the beam stopper facing the optic includes a sensor configured to measure intensity of the x-ray beam.

13. A method for x-ray optic alignment, the method comprising:
  generating a x-ray beam;
  shaping the x-ray beam using an optic;
  directing the x-ray beam through a collimation element;
  sensing the x-ray beam about the collimation element using at least one sensor;
  generating a signal based on step of sensing the x-ray beam; and
  determining alignment of the system based on the signal.

14. The method according to claim 13, wherein the collimation element includes an aperture.

15. The method according to claim 14, wherein the aperture allows the x-ray beam to pass therethrough, and the at least one sensor being fixed to a surface of the collimation element facing the optic.

16. The method according to claim 13, wherein the at least one sensor is a plurality of sensors located at equal intervals radially about the collimation element.

17. The method according to claim 16, wherein each sensor of the at least one sensor forms an aperture having a symmetric shape.

18. The method according to claim 13, wherein the at least one sensor is at least four sensors located at approximately 90 degree intervals about the collimation element.

19. The method according to claim 13, further comprising capturing the signal.

20. The method according to claim 19, further comprising comparing the signal to a subsequent signal.

21. The method according to claim 13, wherein the at least one sensor includes scintillation material coupled with an optical fiber.

22. The method according to claim 21, wherein the optical fiber is connected to a photo-multiplier tube.

23. The method according to claim 13, wherein the at least one sensor includes a photoelectric sensor.

24. The method according to claim 13, further comprising providing a beam stopper and a detector, receiving x-rays from the sample using the detector, locating the beam stopper between the sample and the detector, measuring the intensity of the x-ray beam using a sensor included in a surface of the beam stopper facing the optic.

* * * * *